US012707712B2

(12) United States Patent
Neale et al.

(10) Patent No.: US 12,707,712 B2
(45) Date of Patent: Aug. 11, 2026

(54) AMORPHIZED SUBFINS USING BACKSIDE IMPLANTATION

(71) Applicant: Intel Corporation, Santa Clara, CA (US)

(72) Inventors: Adam Neale, Portand, OR (US); Soonyoung Lee, Portland, OR (US); Md Masud Parvez Arnob, North Plains, OR (US); Norbert Seifert, Beaverton, OR (US); Jeffrey Hicks, Banks, OR (US); Aurelia Chi Wang, Hillsboro, OR (US); Giorgio Mariottini, Hillsboro, OR (US); Jaladhi Mehta, Beaverton, OR (US); Conor P. Puls, Portland, OR (US); Anant H. Jahagirdar, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 434 days.

(21) Appl. No.: 18/217,139

(22) Filed: Jun. 30, 2023

(65) Prior Publication Data

US 2026/0075936 A1 Mar. 12, 2026

(51) Int. Cl.

| | |
|---|---|
| ***H10D 84/85*** | (2025.01) |
| ***H10D 30/47*** | (2025.01) |
| ***H10D 30/67*** | (2025.01) |
| ***H10D 62/10*** | (2025.01) |
| ***H10D 62/13*** | (2025.01) |

(52) U.S. Cl.

CPC ............ *H10D 84/85* (2025.01); *H10D 30/47* (2025.01); *H10D 30/6735* (2025.01); *H10D 30/6757* (2025.01); *H10D 62/118* (2025.01); *H10D 62/151* (2025.01)

(58) Field of Classification Search

CPC .... H10D 84/85; H10D 30/47; H10D 30/6735; H10D 30/6757; H10D 62/118; H10D 62/151

See application file for complete search history.

(56) References Cited

U.S. PATENT DOCUMENTS

| | | | | |
|---|---|---|---|---|
| 2023/0085469 A1* | 3/2023 | Yang | ...................... | H10B 12/34 257/253 |
| 2023/0387012 A1* | 11/2023 | Cheng | ............... | H01L 21/76877 |
| 2024/0387329 A1* | 11/2024 | Lu | ......................... | H01L 23/481 |

* cited by examiner

*Primary Examiner* — Britt Hanley
*Assistant Examiner* — William C. Trice, III
(74) *Attorney, Agent, or Firm* — Arcane Law PLLC

(57) ABSTRACT

Techniques to form semiconductor devices that include subfins that are at least partially amorphized are described. A backside dopant implantation process using dopants (e.g., germanium) may be used to create amorphous semiconductor material in the subfins. In an example, a semiconductor device includes a gate structure around or otherwise on a semiconductor region formed from a fin of semiconductor material. The fin includes a subfin laterally adjacent to a dielectric fill. A backside ion implantation process may be used to implant dopants such as Ge into the subfin and consequently form an amorphized portion of the subfin. In some examples, the amorphized portion is under the gate structure and laterally between a source region and a drain region. The amorphized portion may extend from a bottom surface of the subfin to just under the gate structure, and in some cases, leave a crystalline portion of subfin below the gate structure.

20 Claims, 10 Drawing Sheets

AMORPHIZED SUBFINS USING BACKSIDE IMPLANTATION

FIELD OF THE DISCLOSURE

The present disclosure relates to integrated circuits, and more particularly, to subfins of semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, parasitic affects can increasingly impact the device operation in an undesirable way. Accordingly, there remain a number of non-trivial challenges with respect to forming semiconductor devices and with the reliability of semiconductor devices.

Figure 1A:
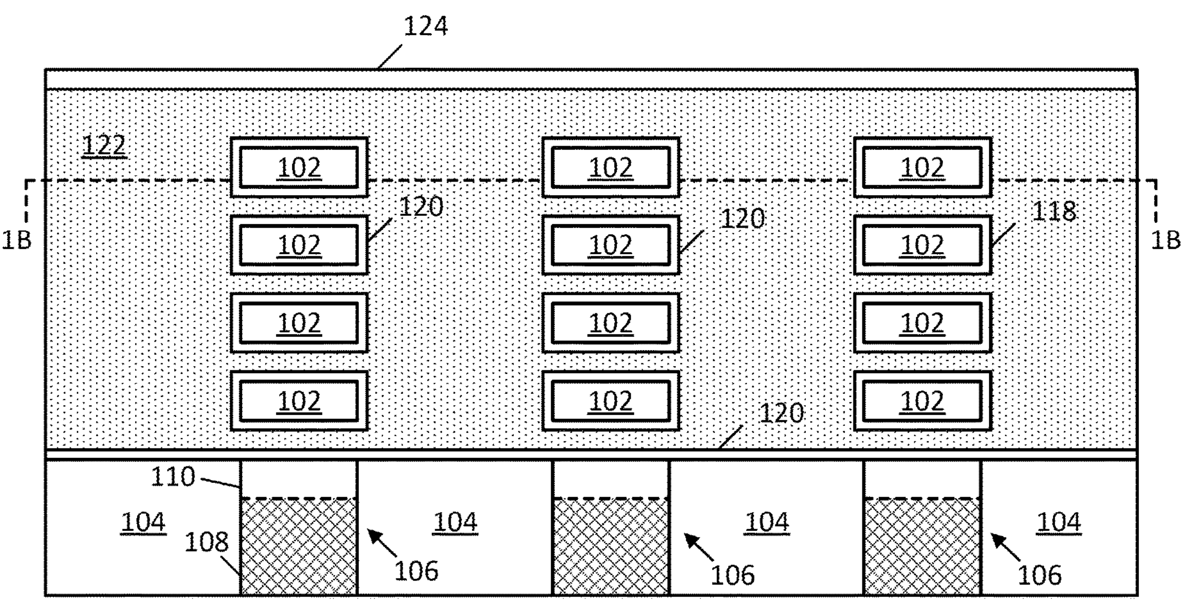
FIGS. 1A and 1B are cross-sectional and plan views, respectively, of some semiconductor devices that have at least partially amorphized subfins, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include subfins that are at least partially amorphized. A backside dopant implantation process using dopants such as germanium (Ge) may be used to create amorphous semiconductor material such as silicon in the subfins. The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region. The semiconductor region can be, for example, a fin of semiconductor material that extends from a source region to a drain region, or one or more nanowires or nanoribbons or nanosheets of semiconductor material that extend from a source region to a drain region. The gate structure includes a gate dielectric (e.g., high-k gate dielectric material) and a gate electrode (e.g., conductive material such as workfunction material and/or gate fill metal). The fin of semiconductor material includes a lower subfin adjacent to a dielectric fill that acts as shallow trench isolation (STI) between semiconductor devices. A backside ion implantation process may be used to implant dopants such as Ge into the subfins and consequently form one or more amorphized portions of the subfin. The amorphized portion(s) may run horizontally below one or more transistor devices, and may have a vertical thickness or depth that extends upward to just below the device(s), such that a thickness of crystalline subfin remains between the gate structure(s) of the device(s) and the amorphized portion(s) of the subfin. In still other examples, the entire vertical thickness of a given subfin (or portion thereof) is amorphized, such that little to no crystalline subfin remains between the device gate structure(s) and the amorphized portion(s). The amorphization has reliability, including radiation effects, benefits with minimal detrimental impact on transistor power and performance characteristics. Numerous variations and embodiments will be apparent in light of this disclosure.

General Overview

As previously noted above, there remain a number of non-trivial challenges with respect to integrated circuit fabrication. In more detail, as devices become smaller and more densely packed, subfins beneath semiconductor regions of the devices can form parasitic junctions between source and drain regions, as at least a portion of the source and drain regions may abut the subfins. The remaining subfin under the gate abutting the device's source and drain regions can create junctions of a parasitic bipolar device. In operation, radiation induced charge can be generated in this subfin and forward bias these junctions, thus amplifying the charge deposited by radiation and causing parasitic current to flow between the source and drain regions through the subfins or more generally any semiconductor region either not controlled by or poorly controlled by the transistor gate. Accordingly, a "subfin" may be used to refer to any semiconductor region that is different from the semiconductor region where the active channel is formed between the source and drain regions. This additional parasitic current can cause the data state (e.g., 0 or 1) of a device or node within the integrated circuit to flip, leading to a higher soft error rate (SER), including single event upsets (SEU). In some cases, charge deposition and amplification by the parasitic bipolar junction may also result in other soft (i.e., non-destructive) or destructive Single Event Effects (SEE) beyond SEU.

Thus, and in accordance with an embodiment of the present disclosure, techniques are provided herein to form subfins that are at least partially amorphized to diminish the gain of the parasitic device formed through the subfins. In some embodiments, the subfins may be a semiconductor material, such as silicon (Si), that is a part of the semiconductor substrate. A bulk portion of the semiconductor substrate may be removed from the backside of the structure to expose the subfins from the bottom. Once exposed, an ion implantation procedure may be performed to implant dopants such as germanium (Ge) into the subfins and form amorphous semiconductor material through at least a portion of a thickness of the subfins. In one example, Ge is implanted into Si subfins to form a first portion of the subfin containing amorphized Si and Ge and a second portion of the subfin containing crystalline Si (and little to no Ge). Due to the backside implantation, the crystalline portion of the subfin may be between the amorphized portion of the subfin and the gate structure above the subfin. In some other examples, the entire subfin is amorphized such that no discernable crystalline regions remain. The amorphized subfin introduces defects that beneficially lower the overall current and charge amplification gain of the parasitic bipolar device that may form between the adjacent source and drain regions and the subfin.

According to an embodiment, an integrated circuit includes a semiconductor region extending from a source or drain region in a first direction, a gate structure extending over the semiconductor region in a second direction different from the first direction, a subfin directly beneath the semiconductor region, and a dielectric layer adjacent to the subfin and beneath the gate structure. At least a portion of the subfin that is laterally adjacent to the source or drain region comprises amorphized semiconductor material (e.g., silicon).

According to an embodiment, an integrated circuit includes a subfin of a semiconductor device. The subfin is beneath a semiconductor region and adjacent to a dielectric layer. The integrated circuit also includes a gate structure over the semiconductor region such that the subfin is beneath the gate structure. At least a portion of the subfin comprises amorphized semiconductor material (e.g., silicon).

According to another embodiment, a method of forming an integrated circuit includes forming a multilayer fin extending in a first direction over a substrate having a first section with first material layers alternating with second material layers, and a subfin beneath the first section; forming a first dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate to form a recess through the multilayer fin; forming a source or drain region from ends of the second material layers and within the recess; replacing the sacrificial gate with a gate structure; removing a portion of the substrate from the backside to expose a bottom surface of the subfin; implanting ions into the backside of the subfin to form an amorphized portion of the subfin; and forming a second dielectric layer over the backside of the subfin.

The techniques can be used with any type of planar or non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of an amorphized semiconductor region within the subfin. In some examples, a crystalline region of the subfin may be observed between the amorphized region and a gate structure above the subfin. In some other embodiments, the entirety of the subfin is amorphized. In some such embodiments, for instance, EDX imaging may be performed to determine the presence of germanium (Ge) within the amorphized regions of a silicon subfin, and the non-presence in subfin portions that have not received the Ge implant. In TEM images of the silicon subfin, non-Ge implanted crystalline silicon may appear darker than the Ge implanted amorphized silicon which will appear lighter. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
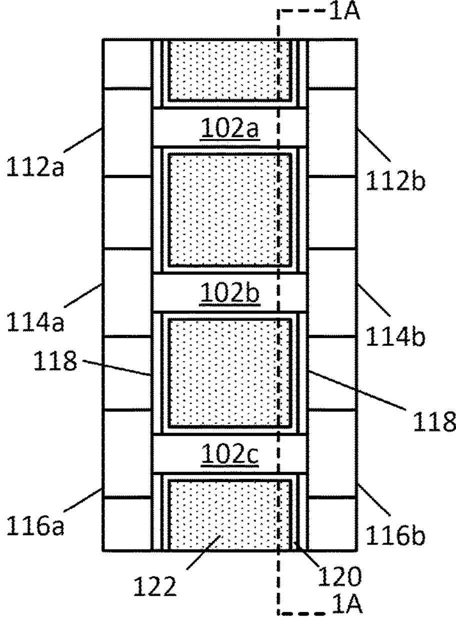

FIG. 1A is a cross-sectional view taken across three example semiconductor devices, according to an embodiment of the present disclosure. FIG. 1B is a plan view of the adjacent semiconductor devices taken across the dashed line 1B-1B depicted in FIG. 1A, and FIG. 1A illustrates the cross-section taken across the dashed line 1A-1A depicted in FIG. 1B. It should be noted that some of the material layers (such as dielectric cap 124) are not visible in the top-down view of FIG. 1B, given the location of the depicted cross-section. Each of the semiconductor devices may be non-planar metal oxide semiconductor (MOS) transistors, such as tri-gate (e.g., finFET) or gate-all-around (GAA) transistors, although other transistor topologies and types could also benefit from the techniques and structures provided herein. The illustrated example embodiments herein use the GAA structure. The illustrated semiconductor devices represent a portion of an integrated circuit that may contain any number of similar semiconductor devices.

Each of the semiconductor devices includes one or more nanoribbons 102 that extend parallel to one another along a direction between a source region and a drain region (e.g., a first direction into and out of the page in the cross-section view of FIG. 1A). Nanoribbons 102 are one example of semiconductor regions or semiconductor bodies that extend between source and drain regions. The term nanoribbon may also encompass other similar shapes such as nanowires or nanosheets. The semiconductor material of nanoribbons 102 may be formed from a substrate. In the illustrated example, the substrate has been removed from the backside thus exposing a bottom surface of a dielectric fill 104 that provides shallow trench isolation (STI) between any adjacent semiconductor devices. Dielectric fill 104 can be any suitable dielectric material, such as silicon dioxide, aluminum oxide, or silicon oxycarbonitride. Any number of backside interconnect structures may be formed under dielectric fill 104 to provide backside power or signal routing for the semiconductor devices.

In some embodiments, the semiconductor devices may each include semiconductor regions in the shape of fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 102 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches, according to some examples.

Each of the semiconductor devices may include a subfin 106. According to some embodiments, subfin 106 comprises the same semiconductor material as the substrate and is adjacent to dielectric fill 104. Subfin 106 may be flanked on opposite sides by dielectric fill 104. According to some embodiments, a first portion 108 of subfin 106 comprises an amorphized semiconductor material. In the case of a silicon substrate, first portion 108 includes amorphized silicon. A backside ion implantation procedure may be performed using a dopant element, such as germanium (Ge), into subfin 106 to form first portion 108. Accordingly, first portion 108 may also include Ge. The depth of the implantation process can vary.

For example, according to some embodiments, subfin 106 includes a second portion 110 above first portion 108. Second portion 110 may include a crystalline semiconductor material, such as crystalline Si. According to some embodiments, second portion 110 represents a portion of subfin 106 that is not amorphized during the backside ion implantation process. In some embodiments, first portion 108 extends through the majority of the total thickness of subfin 106. In some examples, first portion 108 extends through the entire thickness of subfin 106 (such that the first portion 108 extends upward all the way to the bottom surface of the overlying gate structure), such that there is no second portion 110. In some examples, first portion 108 extends through at least 95%, at least 90%, at least 80%, at least 70%, at least 60%, or at least 50% of the total thickness of subfin 106. More generally, a more amorphized subfin yields a more diminished parasitic bipolar device through the subfin.

According to some embodiments, nanoribbons 102 (or other semiconductor bodies) extend between a source and a drain region in the first direction to provide an active region for a transistor (e.g., the semiconductor region beneath the gate). The source and drain regions are not shown in the cross-section of FIG. 1A, but are seen in the top-down view of FIG. 1B where nanoribbons 102*a* of a first semiconductor device extend between a source region 112*a* and a drain region 112*b*, nanoribbons 102*b* of a second semiconductor device extend between a source region 114*a* and a drain region 114*b*, and nanoribbons 102*c* of a third semiconductor device extend between a source region 116*a* and a drain region 116*b*. Any source region may also act as a drain region and vice versa depending on the circuit configuration.

FIG. 1B also illustrates spacer structures 118 that extend around the ends of nanoribbons 102 and along sidewalls of the gate structures between spacer structures 118. Spacer structures 118 may include a dielectric material, such as silicon nitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure extends over nanoribbons 102 of the semiconductor devices along a second direction across the page of FIG. 1A. The second direction may be orthogonal to the first direction. The gate structure includes a gate dielectric 120 and a gate layer (or gate electrode) 122. Gate dielectric 120 represents any number of dielectric layers present between nanoribbons 102 and gate electrode 122. Gate dielectric 120 may also be present on the surfaces of other structures within the gate trench, such as on subfin 106 (or on second portion 110 of subfin 106). Gate dielectric 120 may include any suitable gate dielectric material(s). In some embodiments, gate dielectric 120 includes a layer of native oxide material (e.g., silicon dioxide) on the nanoribbons or other semiconductor regions making up the channel region of the devices, and a layer of high-k dielectric material (e.g., hafnium oxide) on the native oxide.

Gate electrode 122 may represent any number of conductive layers, such as any metal, metal alloy, or doped polysilicon layers. In some embodiments, gate electrode 122 includes one or more workfunction metals around nanoribbons 102. In some embodiments, the semiconductor devices are p-channel devices that include a workfunction metal having titanium around nanoribbons 102. In some embodiments, the semiconductor devices are an n-channel devices that include a workfunction metal having tungsten around nanoribbons 102. Gate electrode 122 may also include a fill metal or other conductive material (e.g., tungsten, ruthenium, molybdenum, copper, aluminum) around the workfunction metals to provide the whole gate electrode structure. In some embodiments, a gate cap 124 may be formed over gate electrode 122 to protect the underlying material during processing. Gate cap 124 may be any suitable dielectric material, such as silicon nitride.

In some embodiments, adjacent gate structures may be separated along the second direction (e.g., across the page, left to right) by a gate cut, which acts like a dielectric barrier or wall, or a power via which routes a power or ground rail between frontside and backside interconnect structures. In either case, the separated semiconductor devices along the second direction can be either n-channel or p-channel devices depending on the circuit configuration.

Fabrication Methodology

FIGS. 2A-2H include cross-sectional views that collectively illustrate an example process for forming an integrated circuit with semiconductor devices having at least partially amorphized subfins, in accordance with an embodiment of the present disclosure. Each figure shows an example structure that results from the process flow up to that point in time, so the depicted structure evolves as the process flow continues, culminating in the structure shown in FIG. 2H, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
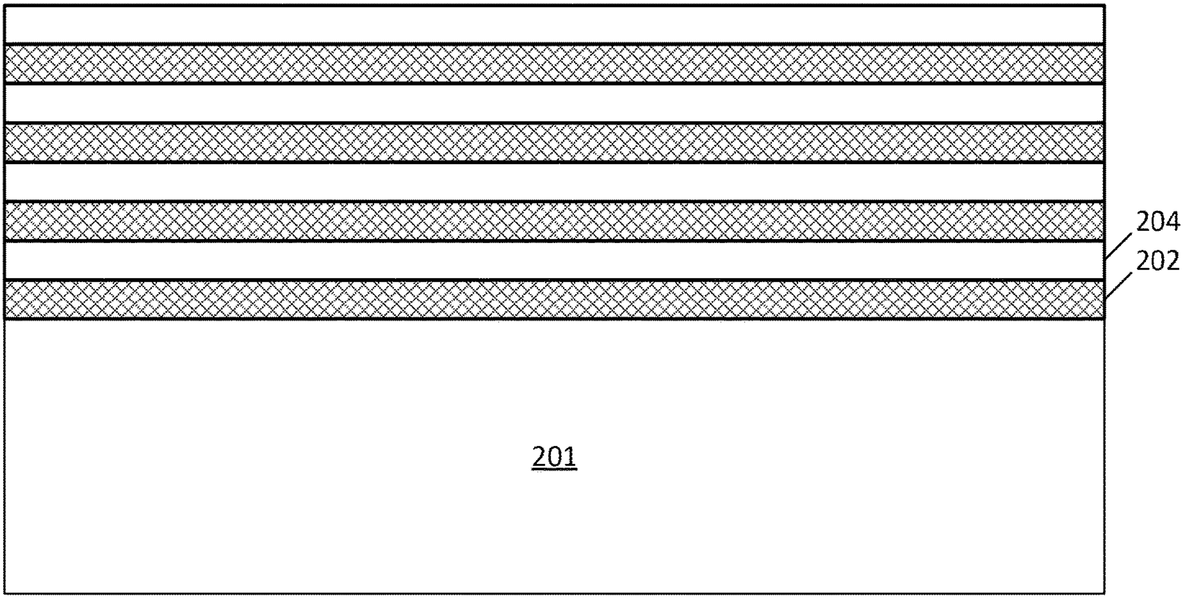
FIGS. 2A-2H are cross-sectional views that illustrate various stages in an example process for forming semiconductor devices that have at least partially amorphized subfins, in accordance with some embodiments of the present disclosure.

FIG. 2A illustrates a cross-sectional view taken through a substrate 201 having a series of material layers formed over the substrate, according to an embodiment of the present disclosure. Substrate 201 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 201 can be a semiconductor-on-insulator substrate having a desired semiconductor layer over a buried insulator layer (e.g., silicon over silicon dioxide). Alternatively, substrate 201 can be a multilayer substrate or superlattice suitable for forming nanowires or nanoribbons (e.g., alternating layers of silicon and SiGe, or alternating layers indium gallium arsenide and indium phosphide). Any number of substrates can be used.

Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD). The geometry (e.g., thickness) of these layers can vary from one embodiment to the next. In some embodiments, the thickness of each sacrificial layer 202 is substantially the same, but they need not be the same. Likewise, the thickness of each of semiconductor layers 204 may be about the same, but they need not be. In some cases, the thickness of each sacrificial layer 202 and semiconductor layer 204 is the same, but they need not be.

Figure 2B:
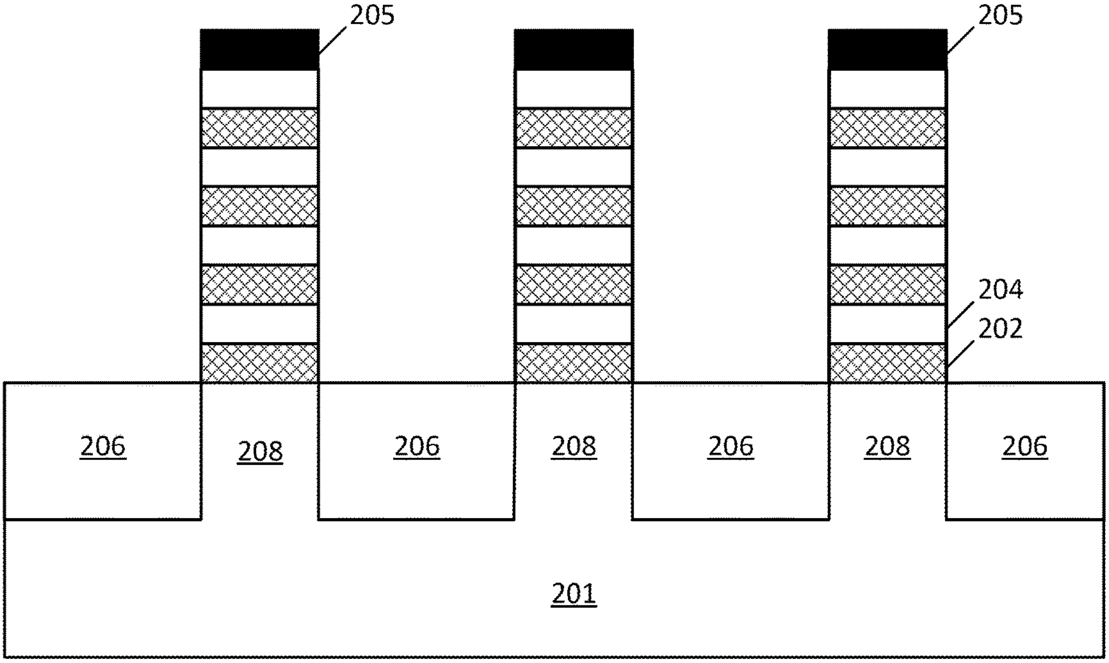

FIG. 2B depicts the cross-section view of the structure shown in FIG. 2A following the formation of a cap layer 205 and the subsequent formation of fins beneath cap layer 205, according to an embodiment. Cap layer 205 may be any suitable hard mask material such as a carbon hard mask (CHM) or silicon nitride. Cap layer 205 is patterned into rows to form corresponding rows of fins from the alternating layer stack of sacrificial layers 202 and semiconductor layers 204. The rows of fins extend lengthwise in a first direction (e.g., into and out of the page).

According to some embodiments, an anisotropic etching process through the layer stack continues into at least a portion of substrate 201. The etched portion of substrate 201 may be filled with a dielectric fill 206 that acts as shallow trench isolation (STI) between adjacent fins. Dielectric fill 206 may be any suitable dielectric material such as silicon dioxide. Subfins 208 represent remaining portions of substrate 201 between dielectric fill 206, according to some embodiments.

Figure 2C:
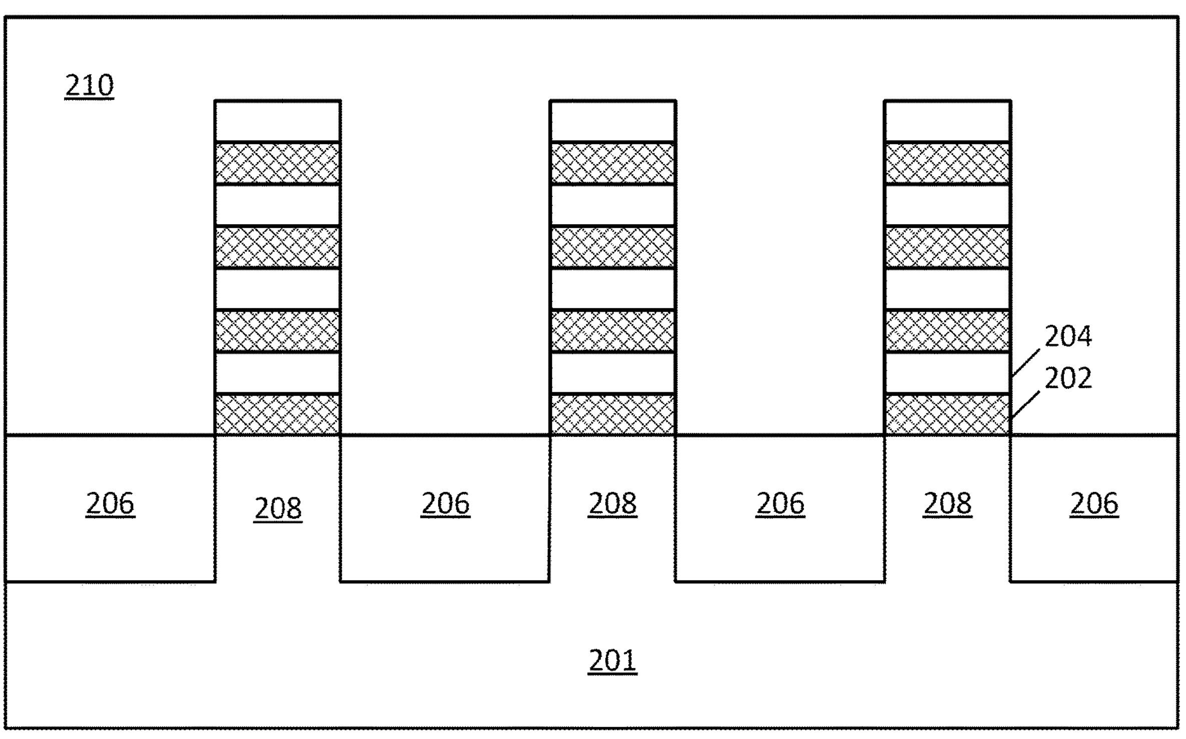

FIG. 2C depicts the cross-section view of the structure shown in FIG. 2B following the formation of a sacrificial gate 210 extending across the fins in a second direction different from the first direction, according to some embodiments. Sacrificial gate 210 may extend across the fins in a second direction that is orthogonal to the first direction. According to some embodiments, the sacrificial gate material is formed in parallel strips across the integrated circuit and removed in all areas not protected by a gate masking layer. Sacrificial gate 210 may be any suitable material that can be selectively removed without damaging the semiconductor material of the fins. In some examples, sacrificial gate 210 includes polysilicon.

Following the formation of sacrificial gate 210 (and prior to replacement of sacrificial gate 210 with a metal gate), additional semiconductor device structures are formed that are not shown in these cross-sections. These additional structures include spacer structures on the sidewalls of sacrificial gate 210 and source and drain regions on either ends of each of the fins. The formation of such structures can be accomplished using any number of processing techniques.

Figure 2D:
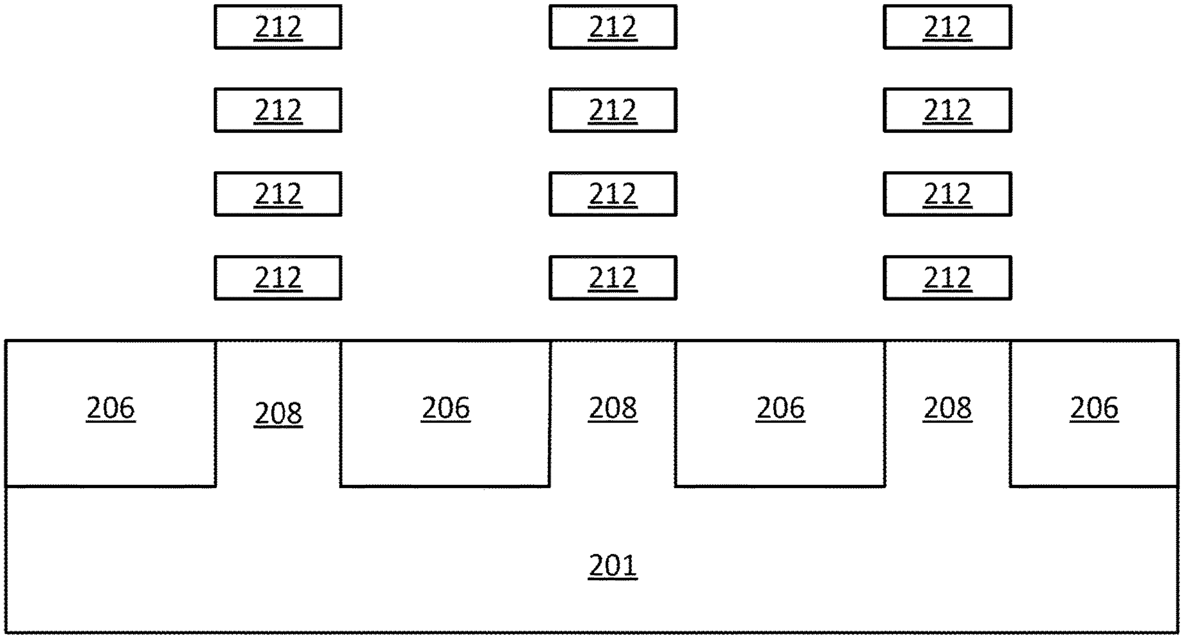

FIG. 2D depicts the cross-section view of the structure shown in FIG. 2C following the removal of sacrificial gate 210 and the removal of sacrificial layers 202, according to some embodiments. In examples where any gate masking layers are still present, they may also be removed at this time. Once sacrificial gate 210 is removed, the fins that had been beneath sacrificial gate 210 are exposed.

In the example where the fins include alternating semiconductor layers, sacrificial layers 202 are selectively removed to release nanoribbons 212 that extend between corresponding source or drain regions. Each vertical set of nanoribbons 212 represents the semiconductor or channel region of a different semiconductor device. It should be understood that nanoribbons 212 may also be nanowires or nanosheets (e.g., from a forksheet arrangement) or fins (e.g., for a finFET arrangement). Sacrificial gate 210 and sacrificial layers 202 may be removed using the same isotropic etching process or different isotropic etching processes.

Figure 2E:
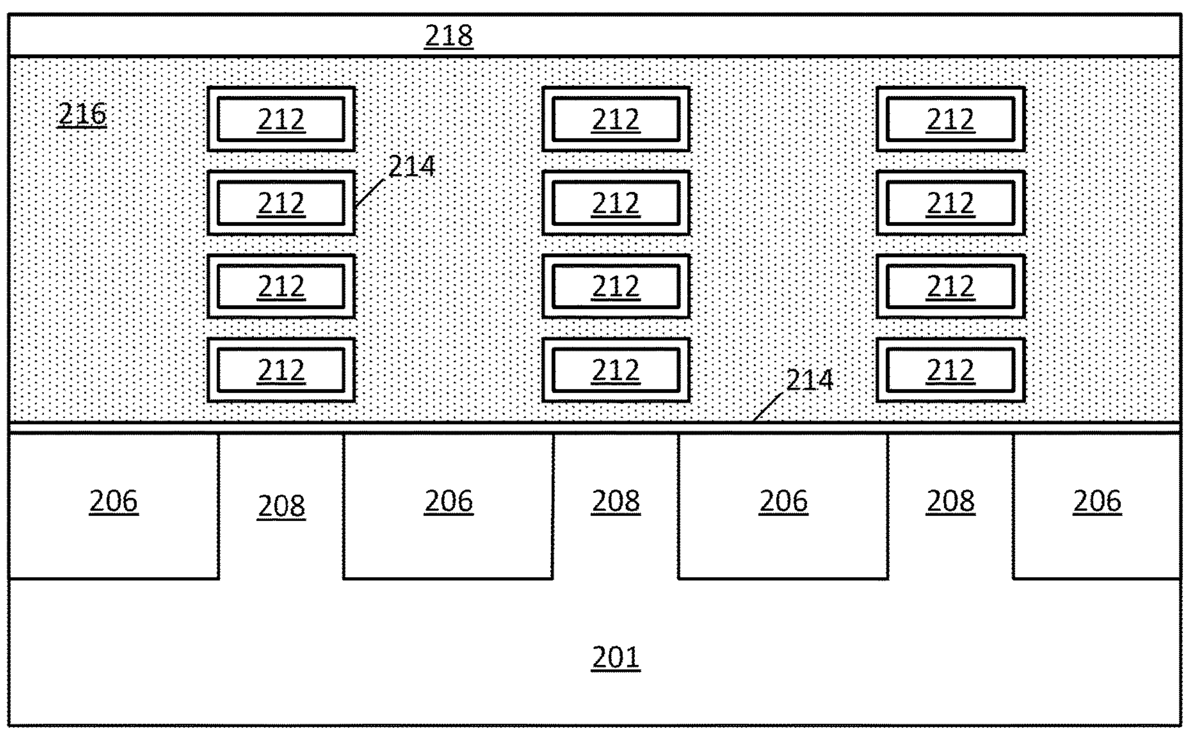

FIG. 2E depicts the cross-section view of the structure shown in FIG. 2D following the formation of a gate structure and subsequent polishing, according to some embodiments. The gate structure includes a gate dielectric 214 and a conductive gate electrode 216. Gate dielectric 214 may be first formed around nanoribbons 212 prior to the formation of gate electrode 216. The gate dielectric 214 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 214 includes a layer of hafnium oxide with a thickness between about 1 nm and about 5 nm. In some embodiments, gate dielectric 214 may include one or more silicates (e.g., titanium silicate, tungsten silicate, niobium silicate, and silicates of other transition metals). In some cases, gate dielectric 214 may include a first layer on nanoribbons 212, and a second layer on the first layer. The first layer can be, for instance, an oxide of the semiconductor material of nanoribbons 212 (e.g., silicon dioxide) and the second layer can be a high-k dielectric material (e.g., hafnium oxide). More generally, gate dielectric 214 can include any number of dielectric layers. According to some embodiments, gate dielectric 214 forms along all surfaces exposed within the gate trench, such as along inner sidewalls of the spacer structures and along the top surfaces of dielectric fill 206 and subfins 208.

As noted above, gate electrode 216 can represent any number of conductive layers. The conductive gate electrode 216 may be deposited using electroplating, electroless plating, CVD, PECVD, ALD, or PVD, to name a few examples. In some embodiments, gate electrode 216 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 216 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Following the formation of the gate structure, the entire structure may be polished or planarized such that the top surface of the gate structure (e.g., top surface of gate electrode 216) is planar with the top surface of other semiconductor elements, such as the spacer structures that define the gate trench.

According to some embodiments, a gate cap 218 may be formed on the top surface of gate electrode 216. Gate cap 218 may be any suitable dielectric material, such as silicon nitride, silicon dioxide, or silicon oxynitride. In some examples, gate electrode 216 is recessed below a top surface of the adjacent spacer structures and gate cap 218 is formed within the recess and polished such that a top surface of gate cap 218 is substantially coplanar with a top surface of the adjacent spacer structures.

Figure 2F:
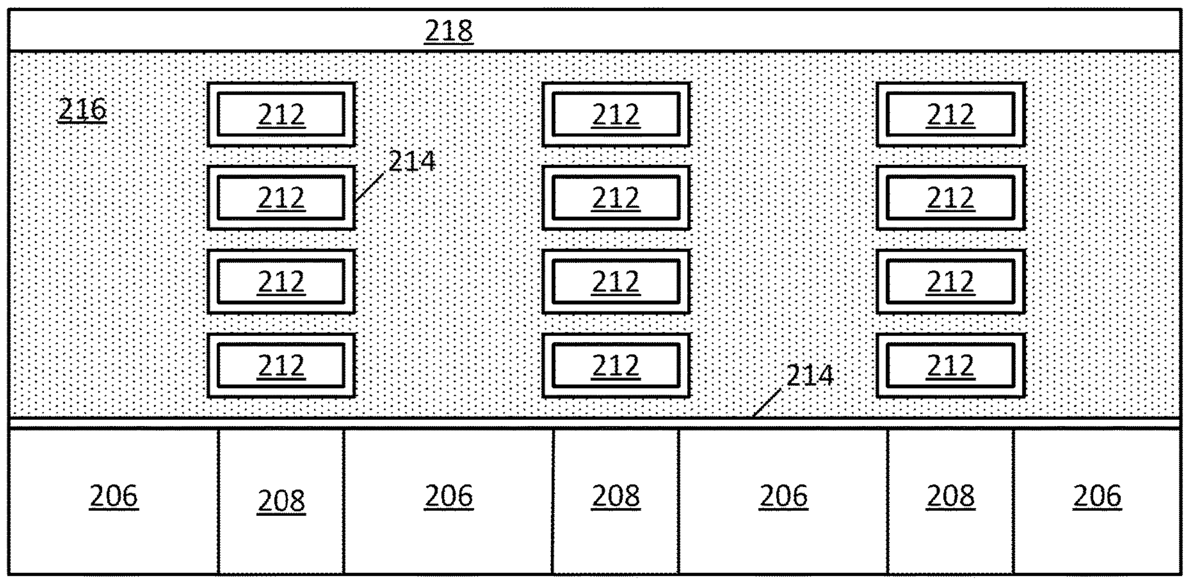

FIG. 2F illustrates another cross-section view of the structure shown in FIG. 2E following the removal of substrate 201 from the backside of the structure, according to some embodiments. Substrate 201 may be removed via chemical mechanical polishing (CMP), or any combination of grinding, polishing, and/or etching processes. In some embodiments, substrate 201 may continue to be thinned from the backside until bottom surfaces of dielectric fill 206 and/or subfins 208 adjacent to dielectric fill 206 are exposed. In some examples, the only portions of the semiconductor material from substrate 201 left behind following the backside removal process are subfins 208.

Figure 2G:
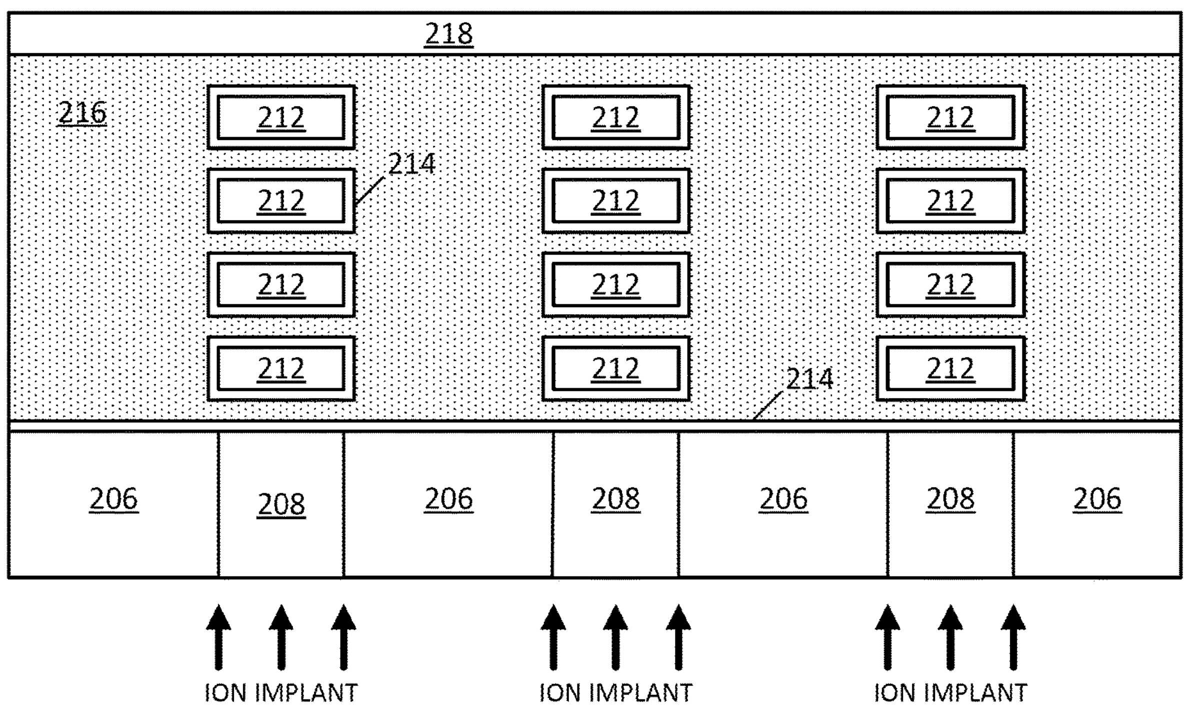

FIG. 2G illustrates another cross-section view of the structure shown in FIG. 2F following an implantation process into the backside of subfins 208, according to some embodiments. An ion implantation procedure may be performed to drive dopants into subfins 208 and form amorphous semiconductor material. The amount of semiconductor amorphization can be controlled via adjustment of the various parameters during the ion implantation process, such as ionization energy and implantation time. In some examples, Ge is implanted into Si subfins at an ionization energy between about 5 keV and 20 keV. Other dopants or combinations of dopants could be implanted as well that result in amorphization of Si or other semiconductor materials of subfin 208. In some embodiments, the ion implantation process is performed to amorphize as much of the subfin as possible without damaging the gate structure.

Figure 2H:
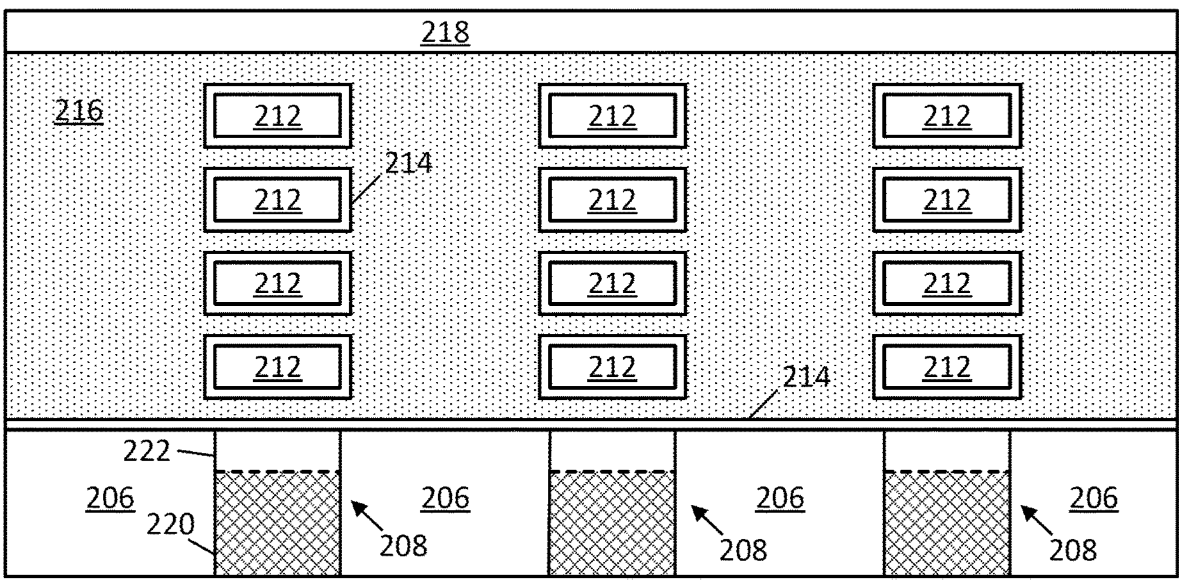

FIG. 2H illustrates another cross-section view of the structure shown in FIG. 2G that illustrates the result of the implantation process, according to some embodiments. A first portion 220 of subfin 208 includes amorphized semiconductor material while a second portion 222 of subfin 208 includes crystalline semiconductor material. Second portion 222 may be between first portion 220 and the gate structure, which includes gate dielectric 214 and gate electrode 216. Depending on the parameters used during the implantation process, first portion 220 may have a thickness (along the z-axis or vertical direction) between about 20 nm and about 30 nm while second portion 222 may have a thickness between about 0 nm and about 7 nm. In some examples, first portion 220 has a thickness that is at least 95%, at least 90%, at least 80%, at least 70%, at least 60%, or at least 50% of the total thickness of subfin 208. As noted above, first portion 220 may include amorphized Si and Ge while second portion 222 includes crystalline Si. In some examples, an entirety of subfin 208 is amorphized such that there is little to no crystalline second portion 222.

Figure 3:
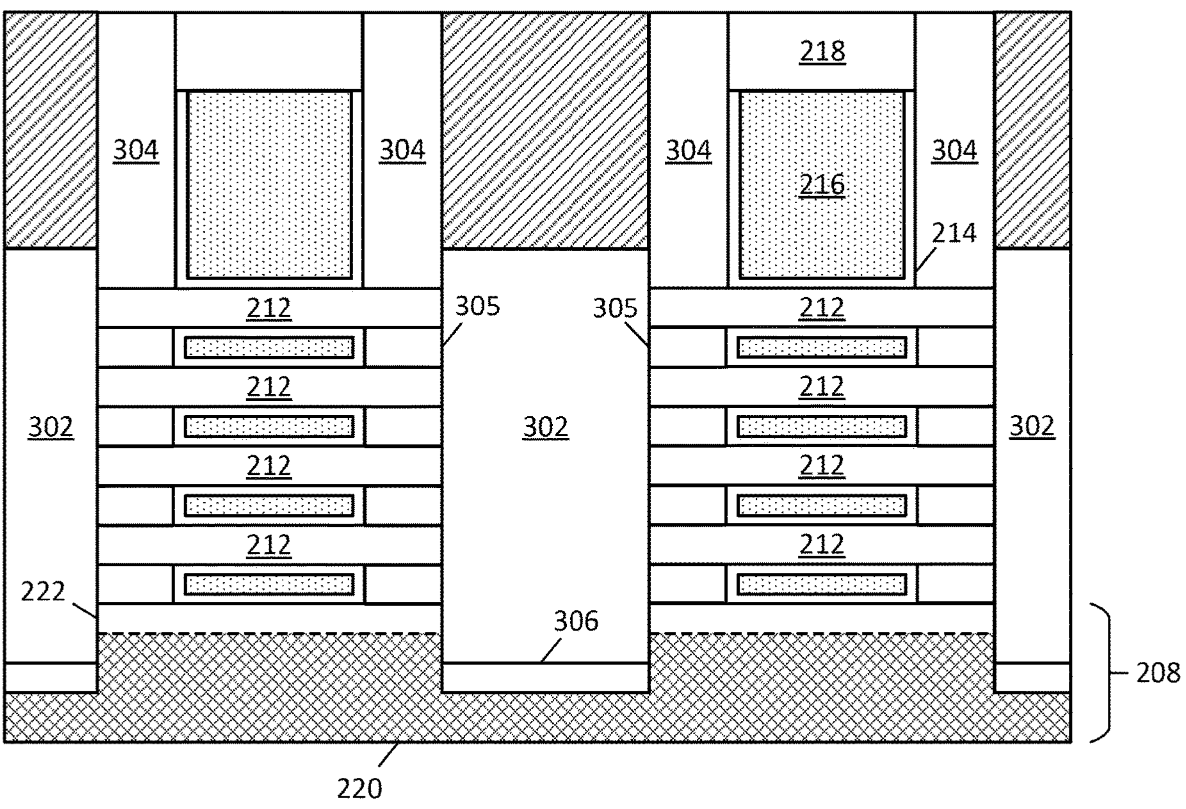
FIG. 3 is another cross-sectional view of semiconductor devices sharing an at least partially amorphized subfin, in accordance with some embodiments of the present disclosure.

FIG. 3 illustrates another cross-section view of the structure shown in FIG. 2H along an orthogonal plane to the cross-section views of FIGS. 2A-2H. The cross-section view of FIG. 3 is taken along the length of several semiconductor devices over a common subfin 208. Source or drain regions 302 between adjacent devices and grown from the ends of nanoribbons 212 extend into at least a portion of subfin 208 within source/drain trenches between spacer structures 304 and inner spacers 305. As discussed above, spacer structures and inner spacers may be any suitable dielectric material, such as silicon nitride, silicon dioxide, or silicon oxynitride. A bottom dielectric layer 306 may be formed at the bottom portion of the source/drain trenches below source or drain regions 302, although other examples may not include dielectric layer 306.

Since source or drain regions 302 may extend into a portion of the underlying subfin 208, a parasitic junction can be formed between the bottoms of the source or drain regions 302 and subfin 208. However, the amorphized first portion 220 of subfin 208 reduces the gain of this parasitic junction device and decreases its affect on the operation of the semiconductor devices using nanoribbons 212. Note that the thickness of the amorphized first portion 220 may vary along the length of a given fin structure. For instance, the amorphized first portion 220 may have a first thickness under source or drain regions 302 and a second thickness under the gate structures, with the second thickness being greater than the first thickness. In some such cases, the second thickness is 4 nm or more greater than the first thickness, or 1.5 or more times thicker. In still other examples, the source or drain regions 302 and bottom dielectric layer 306 together extend through at least an entire thickness of subfin 208, such that the amorphized first portion 220 is not under the source or drain regions 302.

Figure 4:
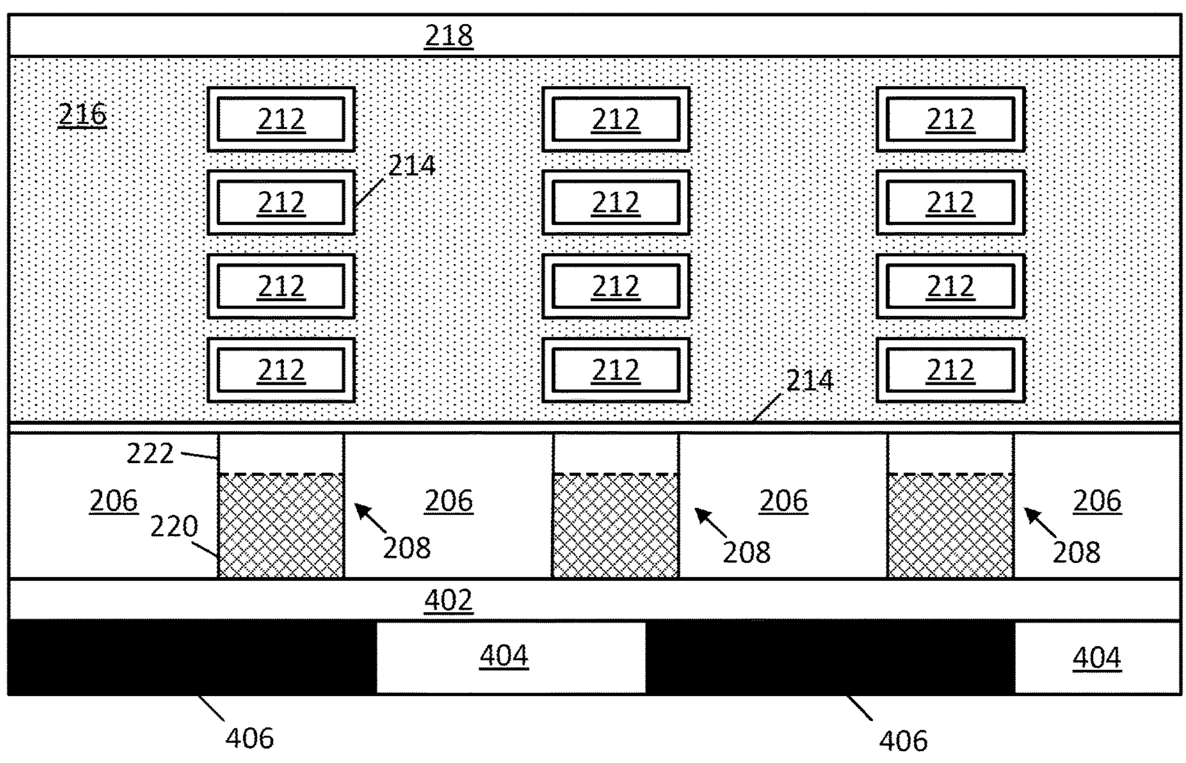
FIG. 4 is a cross-sectional view of semiconductor devices having at least partially amorphized subfins and backside interconnect structures, in accordance with some embodiments of the present disclosure.

FIG. 4 illustrates another cross-section view of the structure shown in FIG. 2H following the optional formation of backside interconnect structures, according to some embodiments. The backside interconnect structures can include any number of dielectric layers and conductive features, such as vias or traces, to route power, ground, or logic signals to any of the semiconductor devices or to any frontside interconnect structures. In the illustrated example, a base dielectric layer 402 is formed over the backside surfaces of dielectric fill 206 and subfins 208, followed by a backside dielectric layer 404 and conductive structures 406 formed within the same plane as backside dielectric layer 404. Both base dielectric layer 402 and backside dielectric layer 404 can be any suitable dielectric material, such as silicon nitride, silicon dioxide, or silicon oxynitride. Conductive structures 406 may include any suitable conductive material, such as tungsten or molybdenum.

Figure 5:
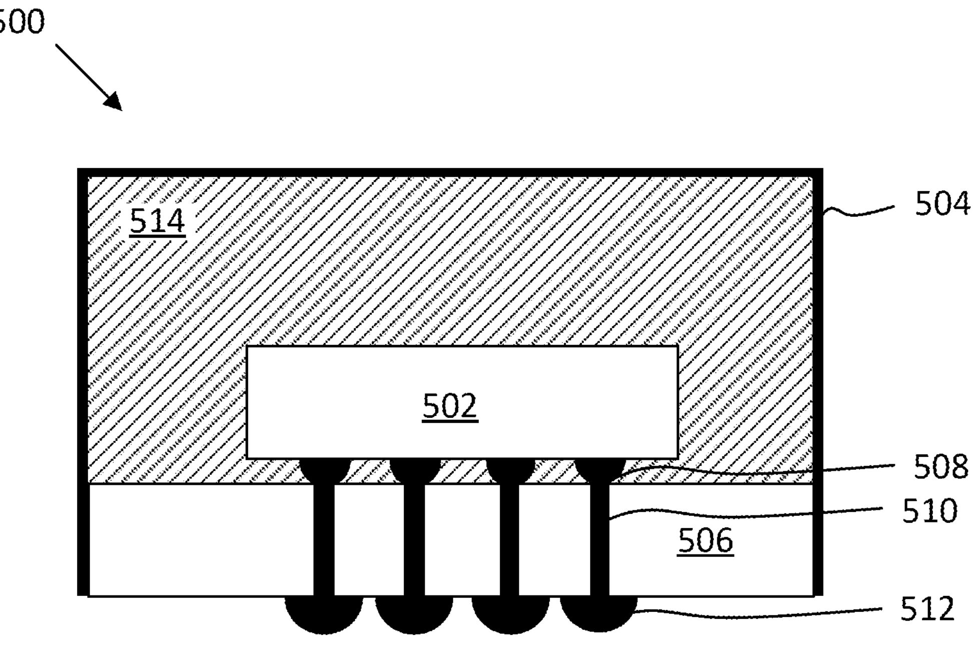
FIG. 5 illustrates a cross-sectional view of a chip package containing one or more semiconductor dies, in accordance with some embodiments of the present disclosure.

FIG. 5 illustrates an example embodiment of a chip package 500, in accordance with an embodiment of the present disclosure. As can be seen, chip package 500 includes one or more dies 502. One or more dies 502 may include at least one integrated circuit having semiconductor devices, such as any of the semiconductor devices disclosed herein. One or more dies 502 may include any other circuitry used to interface with other devices formed on the dies, or other devices connected to chip package 500, in some example configurations.

As can be further seen, chip package 500 includes a housing 504 that is bonded to a package substrate 506. The housing 504 may be any standard or proprietary housing, and may provide, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board (PCB). One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via, or an interconnect structure that meanders through the thickness of substrate 506 to contact one or more intermediate locations therein). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between dies 502 and package substrate 506 as an underfill material, as well as between dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to being electrically insulating.

Methodology

Figure 6:
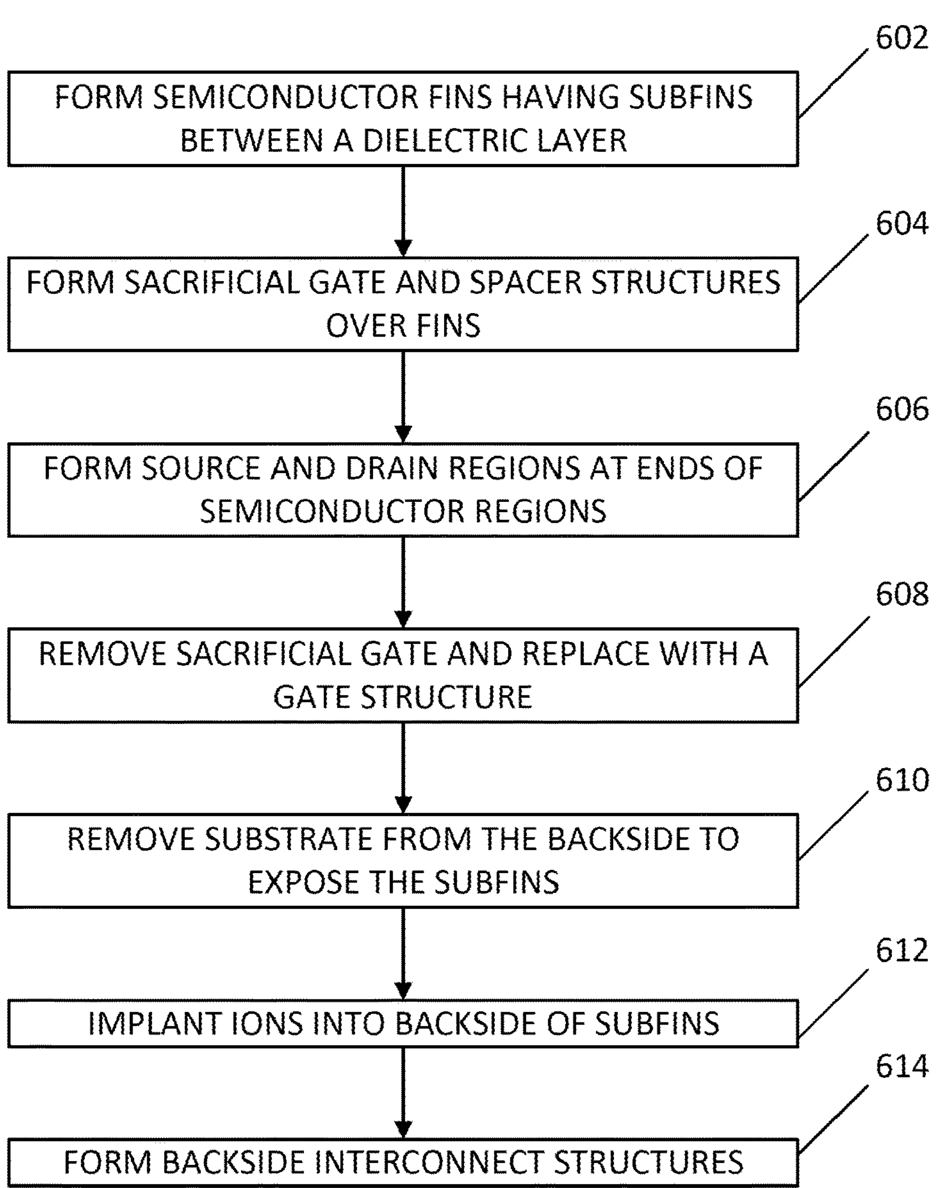
FIG. 6 is a flowchart of a fabrication process for semiconductor devices having at least partially amorphized subfins, in accordance with an embodiment of the present disclosure.

FIG. 6 is a flow chart of a method 600 for forming at least a portion of an integrated circuit, according to an embodiment. Various operations of method 600 may be illustrated in FIGS. 2A-2H. However, the correlation of the various operations of method 600 to the specific components illustrated in the aforementioned figures is not intended to imply any structural and/or use limitations. Rather, the aforementioned figures provide one example embodiment of method 600. Other operations may be performed before, during, or after any of the operations of method 600. For example, method 600 does not explicitly describe all processes that are performed to form common transistor structures. Some of the operations of method 600 may be performed in a different order than the illustrated order.

Method 600 begins with operation 602 where any number of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric layer is formed around subfin portions of the one or more fins. In some embodiments, the dielectric layer extends between each pair of adjacent parallel fins and runs lengthwise in the same direction as the fins. In some embodiments, the anisotropic etching process that forms the fins also etches into a portion of the substrate and the dielectric layer may be formed within the recessed portions of the substrate. Accordingly, the dielectric layer acts as shallow trench isolation (STI) between adjacent fins. The dielectric layer may be any suitable dielectric material, such as silicon dioxide. Lower portions of the fins adjacent to the dielectric layer may be identified as the subfins.

Method 600 continues with operation 604 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 600 continues with operation 606 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions.

Method 600 continues with operation 608 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples. In some embodiments, the gate electrode may be recessed, and a dielectric gate cap is formed within the recessed area.

Method 600 continues with operation 610 where the substrate is removed from the backside of the structure. The substrate may be removed via any combination of grinding, polishing, and/or etching processes. In some embodiments, the substrate is thinned away at least up until bottom surfaces of the dielectric layer and/or subfins adjacent to the dielectric layer are exposed. In some examples, the only portions of the semiconductor material from the substrate left behind following the backside removal process are the subfins.

Method 600 continues with operation 612 where an ion implantation process is performed on the backside of the exposed subfins. The ion implantation procedure may be performed to drive dopants into the subfins and form amorphous semiconductor material. The amount of semiconductor amorphization can be controlled via adjustment of the various parameters during the ion implantation process, such as ionization energy and implantation time. In some examples, Ge is implanted into Si subfins at an ionization energy between about 5 keV and 20 keV, for a period of 5 to 120 seconds (longer dwell time will drive implant deeper into subfin).

As a result of the implantation process, the subfins may include a first portion having amorphized semiconductor material and a second portion that includes crystalline semiconductor material. The second portion may be between the first portion and the gate structure, which includes the gate dielectric and gate electrode. Depending on the parameters used during the implantation process, the first portion may have a thickness thickness that is at least 95%, at least 90%, at least 80%, at least 70%, at least 60%, or at least 50% of the total thickness of the subfins. The first portion may include amorphized Si and Ge while the second portion includes crystalline Si. In some examples, an entirety of the subfins is amorphized such that there is no crystalline second portion.

Method 600 continues with operation 614 where backside interconnect structures are formed beneath the dielectric layer and subfins. The backside interconnect structures may include any number of dielectric layers and conductive structures (e.g., vias and traces). In some examples, one or more of the backside traces may be designed as power or ground rails for the semiconductor devices.

Example System

Figure 7:
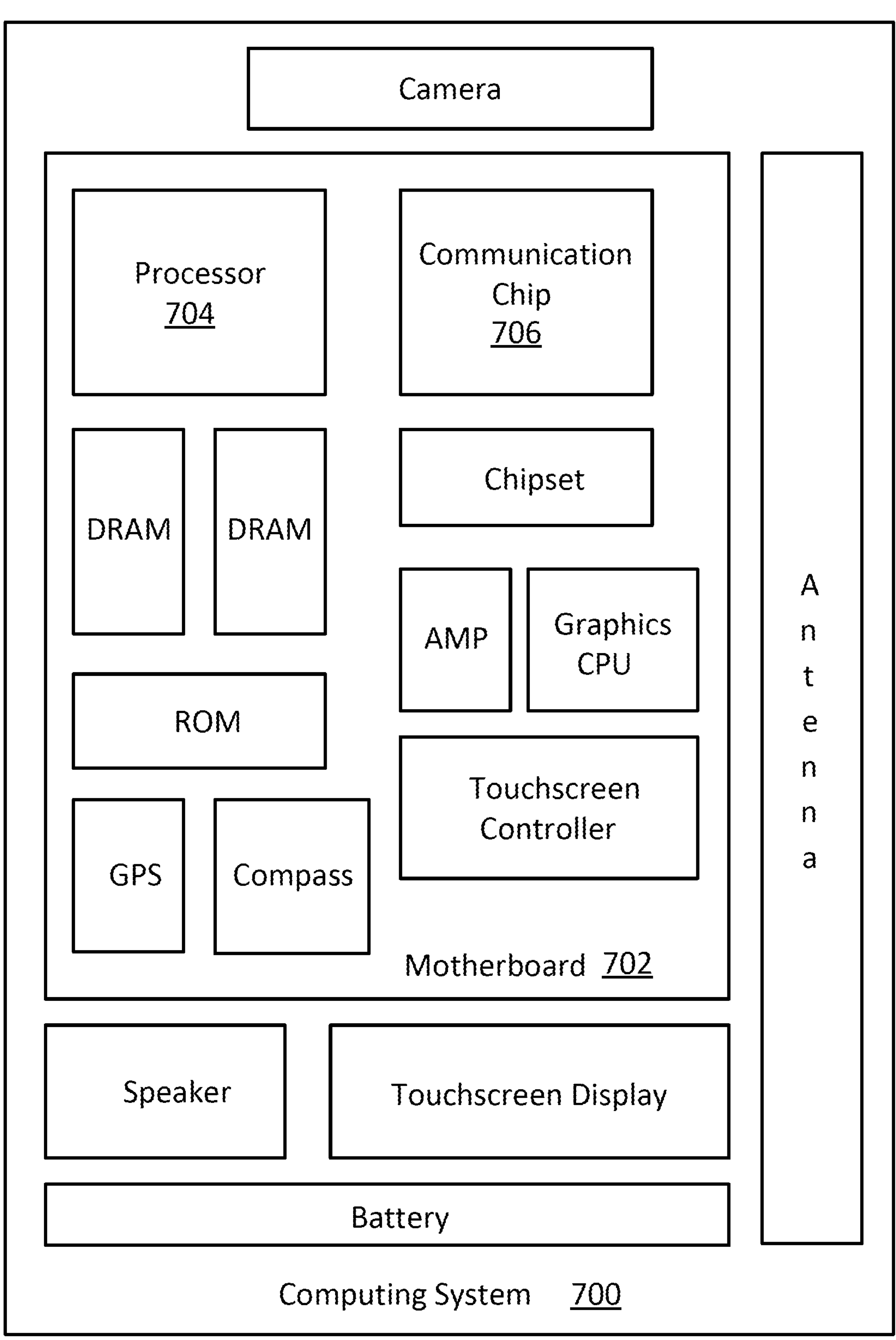
FIG. 7 illustrates a computing system including one or more integrated circuits, as variously described herein, in accordance with an embodiment of the present disclosure.

FIG. 7 is an example computing system implemented with one or more of the integrated circuit structures as disclosed herein, in accordance with some embodiments of the present disclosure. As can be seen, the computing system 700 houses a motherboard 702. The motherboard 702 may include a number of components, including, but not limited to, a processor 704 and at least one communication chip 706, each of which can be physically and electrically coupled to the motherboard 702, or otherwise integrated therein. As will be appreciated, the motherboard 702 may be, for example, any printed circuit board (PCB), whether a main board, a daughterboard mounted on a main board, or the only board of system 700, etc.

Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures or devices configured in accordance with an example embodiment, such as a module including an integrated circuit on a substrate, the substrate having semiconductor devices that have at least partially amorphized subfins. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 706 also may include an integrated circuit die packaged within the communication chip 706. In accordance with some such example embodiments, the integrated circuit die of the communication chip includes one or more semiconductor devices as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 700 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor region extending from a source or drain region in a first direction, a gate structure extending over the semiconductor region in a second direction different from the first direction, a subfin directly beneath the semiconductor region, and a dielectric layer adjacent to the subfin and beneath the gate structure. At least a portion of the subfin that is laterally adjacent to the source or drain region comprises amorphized semiconductor material.

Example 2 includes the integrated circuit of Example 1, further comprising one or more conductive layers on a bottom surface of the dielectric layer, such that the dielectric layer is between the one or more conductive layers and the gate structure.

Example 3 includes the integrated circuit of Example 1 or 2, wherein the gate structure comprises a gate electrode and a gate dielectric, and wherein the gate dielectric is on the subfin.

Example 4 includes the integrated circuit of Example 3, wherein the gate dielectric comprises hafnium and oxygen.

Example 5 includes the integrated circuit of any one of Examples 1-4, wherein the dielectric layer comprises silicon and oxygen.

Example 6 includes the integrated circuit of any one of Examples 1-5, wherein the portion of the subfin that is laterally adjacent to the source or drain region and comprises amorphized semiconductor material extends from a bottom surface of the gate structure to a bottom surface of the subfin.

Example 7 includes the integrated circuit of any one of Examples 1-5, wherein a first portion of the subfin comprises amorphized semiconductor material and a second portion of the subfin comprises crystallized semiconductor material, the second portion being between the first portion and the semiconductor region.

Example 8 includes the integrated circuit of any one of Examples 1-7, wherein the amorphized semiconductor material comprises silicon and germanium.

Example 9 includes the integrated circuit of any one of Examples 1-8, wherein the semiconductor region comprises one or more crystalline semiconductor nanoribbons.

Example 10 includes the integrated circuit of Example 9, wherein the one or more semiconductor nanoribbons comprises germanium, silicon, or any combination thereof.

Example 11 is a printed circuit board comprising the integrated circuit of any one of Examples 1-10.

Example 12 is an electronic device that includes a chip package having one or more dies. At least one of the one or more dies includes a semiconductor device having a semiconductor region extending in a first direction from a source or drain region and a gate structure extending over the semiconductor region in a second direction different from the first direction, a subfin directly beneath the semiconductor region, and a dielectric layer laterally adjacent to the subfin. At least a portion of the subfin that is laterally adjacent to the source or drain region and under the gate structure comprises amorphized silicon.

Example 13 includes the electronic device of Example 12, wherein the at least one of the one or more dies further comprises one or more conductive layers on a bottom surface of the dielectric layer, such that the dielectric layer is between the one or more conductive layers and the gate structure.

Example 14 includes the electronic device of Example 12 or 13, wherein the gate structure comprises a gate electrode and a gate dielectric, and wherein the gate dielectric is on the subfin.

Example 15 includes the electronic device of Example 14, wherein the gate dielectric comprises hafnium and oxygen.

Example 16 includes the electronic device of any one of Examples 12-15, wherein the dielectric layer comprises silicon and oxygen.

Example 17 includes the electronic device of any one of Examples 12-16, wherein an entirety of the subfin comprises amorphized silicon.

Example 18 includes the electronic device of any one of Examples 12-16, wherein a first portion of the subfin comprises amorphized silicon and a second portion of the subfin comprises crystallized silicon, the second portion being between the first portion and the semiconductor region.

Example 19 includes the electronic device of any one of Examples 12-18, wherein the at least a portion of the subfin comprises germanium.

Example 20 includes the electronic device of any one of Examples 12-19, wherein the semiconductor region comprises one or more semiconductor nanoribbons.

Example 21 includes the electronic device of Example 20, wherein the one or more semiconductor nanoribbons comprises germanium, silicon, or any combination thereof.

Example 22 includes the electronic device of any one of Examples 12-21, further comprising a printed circuit board, wherein the chip package is attached to the printed circuit board.

Example 23 is a method of forming an integrated circuit. The method includes forming a multilayer fin extending in a first direction over a substrate having a first section with first material layers alternating with second material layers, and a subfin beneath the first section; forming a first dielectric layer adjacent to the subfin; forming a sacrificial gate and spacers on sidewalls of the sacrificial gate, the sacrificial gate extending in a second direction over the multilayer fin, the second direction being different from the first direction; removing an exposed portion of the multilayer fin adjacent to the sacrificial gate to form a recess through the multilayer fin; forming a source or drain region from ends of the second material layers and within the recess; replacing the sacrificial gate with a gate structure; removing a portion of the substrate from a backside of the integrated circuit to expose a bottom surface of the subfin; implanting ions into the backside of the subfin to form an amorphized portion of the subfin; and forming a second dielectric layer over the backside of the subfin.

Example 24 includes the method of Example 23, wherein the first material layers comprise silicon and germanium and the second material layers comprise silicon.

Example 25 includes the method of Example 23 or 24, further comprising forming one or more backside conductive traces on a bottom surface of the second dielectric layer.

Example 26 includes the method of any one of Examples 23-25, wherein implanting ions comprises implanting Ge into the subfin.

Example 27 is an integrated circuit that includes a subfin of a semiconductor device. The subfin is beneath a semiconductor region and adjacent to a dielectric layer. The integrated circuit also includes a gate structure over the semiconductor region such that the subfin is beneath the gate structure. At least a portion of the subfin comprises amorphized semiconductor material.

Example 28 includes the integrated circuit of Example 27, further comprising one or more conductive layers on a bottom surface of the dielectric layer, such that the dielectric layer is between the one or more conductive layers and the gate structure.

Example 29 includes the integrated circuit of Example 27 or 28, wherein the gate structure comprises a gate electrode and a gate dielectric, and wherein the gate dielectric is on the subfin.

Example 30 includes the integrated circuit of Example 29, wherein the gate dielectric comprises hafnium and oxygen.

Example 31 includes the integrated circuit of any one of Examples 27-30, wherein the dielectric layer comprises silicon and oxygen.

Example 32 includes the integrated circuit of any one of Examples 27-31, wherein the at least a portion of the subfin comprising amorphized silicon is laterally between a source region and a drain region.

Example 33 includes the integrated circuit of any one of Examples 27-32, wherein the at least a portion of the subfin comprising amorphized silicon is a first portion of the subfin, and a second portion of the subfin comprises crystallized silicon, the second portion being between the first portion and the semiconductor region.

Example 34 includes the integrated circuit of any one of Examples 27-33, wherein the at least a portion of the subfin comprising amorphized silicon further comprises germanium.

Example 35 includes the integrated circuit of any one of Examples 27-34, wherein the semiconductor region comprises one or more semiconductor nanoribbons.

Example 36 includes the integrated circuit of Example 35, wherein the one or more semiconductor nanoribbons comprises germanium, silicon, or any combination thereof.

Example 37 is a printed circuit board comprising the integrated circuit of any one of Examples 27-36.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a semiconductor region extending from a source or drain region in a first direction;

a gate structure extending over the semiconductor region in a second direction different from the first direction;

a subfin directly beneath the semiconductor region, wherein a first portion of the subfin that is laterally adjacent to the source or drain region comprises amorphized semiconductor material, and a second portion of the subfin that is laterally adjacent to the source or drain region comprises crystallized semiconductor material, the second portion being directly on the first portion; and a dielectric layer adjacent to the subfin and beneath the gate structure.

2. The integrated circuit of claim 1, wherein the dielectric layer is a first dielectric layer and the integrated circuit further comprises one or more conductive layers on a bottom surface of a second dielectric layer, such that the second dielectric layer is between the one or more conductive layers and the first dielectric layer.

3. The integrated circuit of claim 1, wherein the gate structure comprises a gate electrode and a gate dielectric, and wherein the gate dielectric is on the subfin.

4. The integrated circuit of claim 1, wherein the second portion of the subfin is between the first portion of the subfin and the semiconductor region.

5. The integrated circuit of claim 1, wherein the amorphized semiconductor material comprises silicon and germanium.

6. The integrated circuit of claim 1, wherein a printed circuit board comprises the integrated circuit of claim 1.

7. An electronic device, comprising:

a chip package comprising one or more dies, at least one of the one or more dies comprising a semiconductor device having a semiconductor region extending in a first direction from a source or drain region, and a gate structure extending over the semiconductor region in a second direction different from the first direction;

a subfin directly beneath the semiconductor region, wherein a first portion of the subfin that is laterally adjacent to the source or drain region and under the gate structure comprises amorphized silicon, and a second portion of the subfin that is laterally adjacent to the source or drain region and under the gate structure comprises crystallized semiconductor material, the second portion being directly on the first portion; and a dielectric layer laterally adjacent to the subfin.

8. The electronic device of claim 7, wherein the gate structure comprises a gate electrode and a gate dielectric, and wherein the gate dielectric is on the subfin.

9. The electronic device of claim 7, wherein the second portion of the subfin is between the first portion of the subfin and the semiconductor region.

10. The electronic device of claim 7, wherein the first portion of the subfin comprises germanium.

11. The electronic device of claim 7, further comprising a printed circuit board, wherein the chip package is attached to the printed circuit board.

12. An integrated circuit comprising:

a subfin of a semiconductor device, the subfin being beneath a semiconductor region and laterally adjacent to a dielectric layer, wherein a first portion of the subfin comprises amorphized silicon, and a second portion of the subfin comprises crystallized semiconductor material, the second portion being directly on the first portion; and a gate structure over the semiconductor region such that the subfin is beneath the gate structure.

13. The integrated circuit of claim 12, wherein the dielectric layer is a first dielectric layer and the integrated circuit further comprises one or more conductive layers on a bottom surface of a second dielectric layer, such that the second dielectric layer is between the one or more conductive layers and the first dielectric layer.

14. The integrated circuit of claim 12, wherein the gate structure comprises a gate electrode and a gate dielectric, and wherein the gate dielectric is on the subfin.

15. The integrated circuit of claim 12, wherein the second portion of the subfin is laterally between a source region and a drain region.

16. The integrated circuit of claim 12, wherein the second portion of the subfin is between the first portion of the subfin and the semiconductor region.

17. The integrated circuit of claim 12, wherein the first portion of the subfin comprises germanium.

18. The integrated circuit of claim 12, wherein a printed circuit board comprises the integrated circuit.

19. The integrated circuit of claim 1, wherein the first portion of the subfin extends through at least 90% of a total thickness of the subfin.

20. The integrated circuit of claim 12, wherein the first portion of the subfin extends through at least 90% of a total thickness of the subfin.

* * * * *